(12) United States Patent
Shannon et al.

(10) Patent No.: US 6,879,870 B2
(45) Date of Patent: Apr. 12, 2005

(54) METHOD AND APPARATUS FOR ROUTING HARMONICS IN A PLASMA TO GROUND WITHIN A PLASMA ENHANCED SEMICONDUCTOR WAFER PROCESSING CHAMBER

(76) Inventors: Steven C. Shannon, 800 N. Delaware, Apt. 308, San Mateo, CA (US) 94401; Daniel J. Hoffman, 12343 Arroyo de Arguello, Saratoga, CA (US) 95070; Michael Barnes, 12215 Santa Teresa Dr., San Ramon, CA (US) 94583; Lee LaBlanc, 355 N. Wolfe Rd., Apt. 314, Sunnyvale, CA (US) 94085

( * ) Notice: Subject to any disclaimer, the term of this patent is extended or adjusted under 35 U.S.C. 154(b) by 0 days.

(21) Appl. No.: 10/124,191

(22) Filed: Apr. 16, 2002

(65) Prior Publication Data

US 2003/0192475 A1 Oct. 16, 2003

(51) Int. Cl.[7] .............................................. G01F 19/00
(52) U.S. Cl. ....................................................... 700/121
(58) Field of Search .......................................... 700/121

(56) References Cited

U.S. PATENT DOCUMENTS 6,535,785 B2 * 3/2003 Johnson et al. ............. 700/121
6,537,421 B2 3/2003 Drewery

FOREIGN PATENT DOCUMENTS

EP 1 193 746 A1 4/2002
WO WO 01/71765 A2 9/2001

OTHER PUBLICATIONS

PCT Search Report dated Jan. 2, 2004 for Application No. PCT/US03/11781.

* cited by examiner

Primary Examiner—John F. Niebling
Assistant Examiner—Andre' C. Stevenson
(74) Attorney, Agent, or Firm—Moser Patterson Sheridan LLC; Joseph Bach

(57) ABSTRACT

A method and apparatus for routing harmonic energy within a plasma to ground in a plasma enhanced semiconductor wafer processing reactor. A model of the chamber is used to determine the pathway for RF power and the harmonic energy of that RF power through the chamber. From this model, the placement and design of a harmonic routing circuit is determined to shunt the harmonic energy to ground.

16 Claims, 5 Drawing Sheets

METHOD AND APPARATUS FOR ROUTING HARMONICS IN A PLASMA TO GROUND WITHIN A PLASMA ENHANCED SEMICONDUCTOR WAFER PROCESSING CHAMBER

BACKGROUND OF THE INVENTION

1. Field of the Invention

The present invention generally relates to plasma enhanced semiconductor wafer processing chambers. More specifically, the invention relates to the method and apparatus for routing harmonics in a plasma to ground within a plasma enhanced semiconductor wafer processing chamber.

2. Description of the Related Art

A plasma enhanced semiconductor wafer processing reactor generally comprises a vacuum vessel for containing one or more gases, a pedestal for supporting a semiconductor wafer or other workpiece within the vacuum vessel, and a power supply for applying energy to the gases to form a plasma within the vacuum vessel. Depending upon the structure of the vessel and the nature of the gases, processing within the vessel may include physical vapor deposition, chemical vapor deposition, plasma annealing or etching. In some chambers, particularly, a reactive ion etch chamber, the radio frequency (RF) power may be applied to the pedestal that supports the wafer, while the vessel itself is grounded. The RF power couples to the gases in the vessel and ignites a plasma.

During plasma processing, the plasma sheath proximate the pedestal forms a non-linear rectifier that produces harmonic energy within the plasma. The harmonic energy is at frequencies that are harmonics of the frequency of the applied RF power. Such harmonics distort the operation of the plasma and can cause nonuniformity in the plasma processing of the wafer. Such nonuniformities manifest themselves in an etch reactor as a nonuniform etching of the wafer and manifest themselves as non-uniform deposition in a deposition chamber. Nonuniform etching of a wafer can cause ineffective etching of certain portions of the wafer, as well as induce currents in the devices that have been formed on the wafer and destroy those devices.

Therefore, there is a need in the art for a method and apparatus for controlling harmonics that are generated in the plasma.

SUMMARY OF THE INVENTION

The present invention is a method and apparatus for routing harmonic energy in a plasma to ground within a plasma enhanced semiconductor wafer processing chamber. The invention uses a model of the chamber and its RF drive electronics to determine coupling pathways for the applied RF power and the associated harmonic energy. From this model, the placement and design of a harmonic shunt can be determined to route the harmonic energy to ground and suppress the effect of the harmonic energy upon the plasma processing. In one embodiment of the invention, the circuit for routing the harmonics in a plasma reactor is an RLC resonant parallel circuit that is coupled from the main RF feed of a plasma chamber to ground. The RLC circuit is tuned to the harmonic frequency that is to be suppressed. For example, if the drive frequency is 13.56 MHz, the RLC circuit may be tuned to a harmonic of that frequency such as 27 MHz to shunt the second harmonic energy to ground. In another embodiment of the invention, the RF feed structure is modified to produce a low impedance path to ground for the harmonic energy without using additional circuitry. With the reduction of harmonics in the plasma, the plasma processing uniformity is improved over the prior art.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
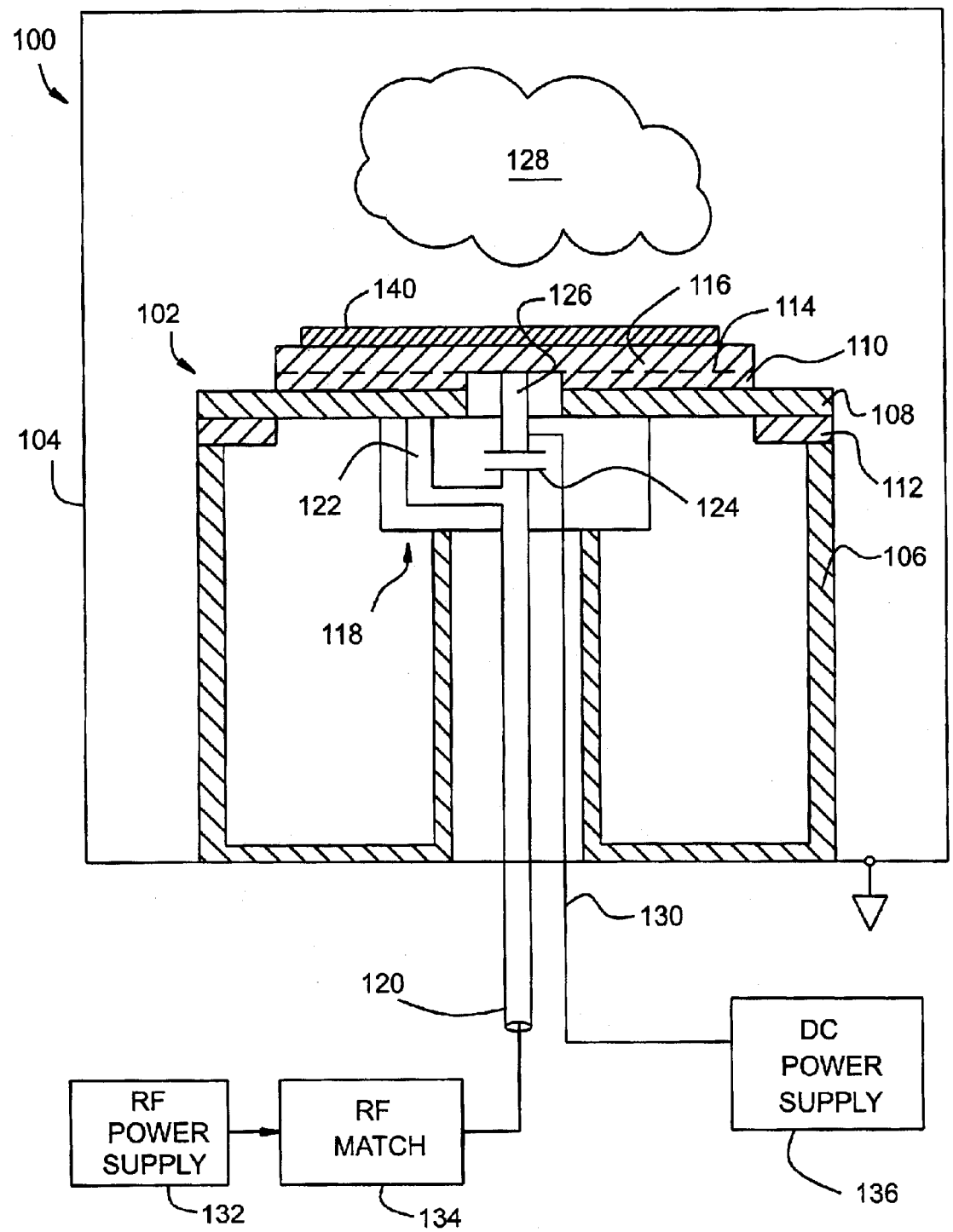
FIG. 1 depicts a schematic cross-sectional view of a prior art dual feed, cathode pedestal within a plasma enhanced semiconductor wafer processing chamber.

FIG. 1 depicts a schematic cross-sectional view of a prior art dual feed, cathode pedestal 102 of a plasma enhanced, semiconductor wafer processing chamber 100. The cathode pedestal 102 is positioned to support a semiconductor wafer or workpiece 140 within a vacuum vessel 104. The cathode pedestal 102 comprises a housing 106, a cooling plate 108, an insulator ring 112 and an electrostatic chuck 110. The electrostatic chuck 110 comprises an electrode 114 generally formed of molybdenum mesh embedded in a ceramic body 116. The electrostatic chuck 110 is mounted to the cooling plate 108 which rests on the insulator ring 112 above the housing 106. An RF feed structure 118 is coupled through the center of the housing 106 to the chuck electrode 114. The RF feed structure 118 comprises a first conductor 120, a second conductor 122, a capacitor bank 124, and a third conductor 126.

The first conductor 120, the capacitor bank 124 and the third conductor 126 are connected in series to couple RF power, applied to the first conductor 120 via an RF power supply 132 and RF match 134, to the electrode 114. The second conductor 122 branches from the first conductor 120 prior to the capacitor bank 124 and couples to the cooling plate 108. As such, RF power is coupled to the plasma 128 from both the electrode 114 and the cooling plate 108, i.e., a dual feed structure. The cooling plate 108 forms a first RF radiator and the electrode 114 forms a second RF radiator.

The electrostatic chuck 110 retains a wafer 140 using a DC voltage supplied by DC power supply 136. The DC voltage is coupled to the third conductor 126 via DC conductor 130. As is well known in the art, when the DC voltage is applied to the chuck electrode 114, the wafer 140 is electrostatically attracted to the electrode 114 such that the wafer 140 is held against the support surface of the chuck 110.

Figure 2:
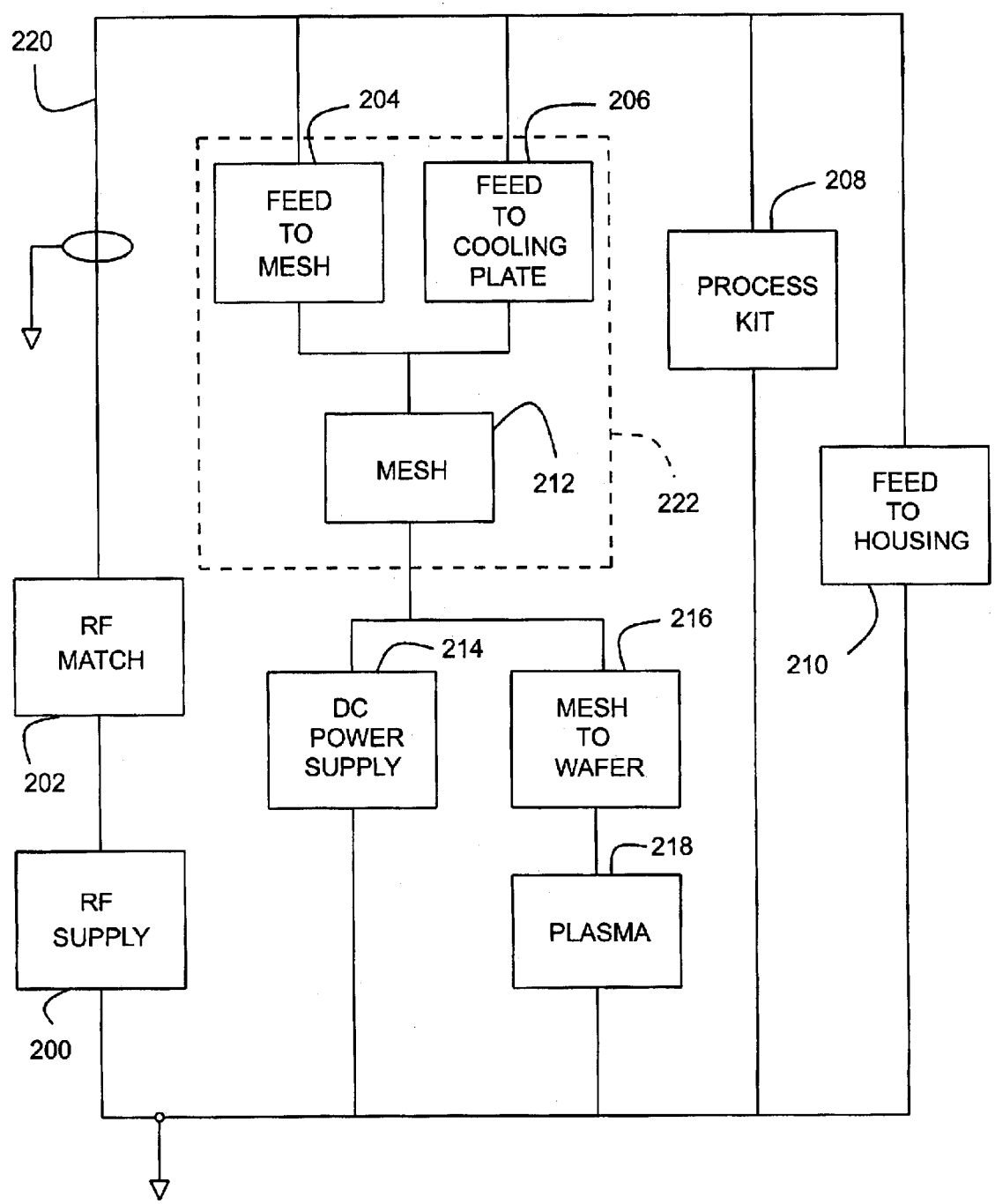
FIG. 2 depicts an equivalent circuit representation of the RF power delivery through the cathode pedestal of FIG. 1.

FIG. 2 depicts the equivalent circuit representation (model) of the RF power delivery pathway, through the prior art cathode pedestal 102 of FIG. 1. When analyzing the RF characteristic of a plasma chamber, with particular regard to its power delivery system, the power delivery pathways can be modeled using a "lump circuit" diagram where each complex impedance is represented by a block in the diagram. RF power at a fundamental frequency is provided by a RF power supply 200 and delivered to the plasma load 218 through the chamber's RF circuitry. Each of the lump elements in the cathode equivalent circuit represents the physical elements within the cathode pedestal, each of which occupy different spatial regions within the chamber. In FIG. 2, the RF supply 200 is coupled to a match unit 202 that matches the power supply to the RF characteristics of the chamber at the fundamental frequency. The RF power is coupled through a coaxial cable 220 that is terminated at the feed structure 222 that carries the power to the mesh 212. The feed structure comprises the feed to the mesh 204 (e.g., first conductor 120, capacitor bank 124 and third conductor 126), the feed to the cooling plate 206 (e.g., first conductor 120 and second conductor 122) and the mesh 212 (e.g., chuck electrode 114). The DC voltage supply that supplies the DC to the mesh electrode, the mesh electrode to wafer coupling and the plasma itself are represented as lump impedance elements 214, 216 and 218. The process kit (e.g., various components within the chamber that facilitate a particular type of processing of the wafer) and the feed structure to housing coupling are represented by impedance elements 208 and 210.

The model is produced using MathCAD. Each "lump element" is defined as a complex impedance that is defined by the chamber structure. For example, the feed structure is a conductor passing through a cylindrical ground plane that can be modeled as a barrel capacitor. The chuck electrode can be modeled as a radial transmission line. To confirm the accuracy of the model, the $S_{11}$ parameter (input reflection coefficient) of the model is compared to the actual $S_{11}$ of the cathode pedestal. The model can then be "tweaked" until the model's $S_{11}$ parameter equals the actual $S_{11}$ parameter.

Figure 3:
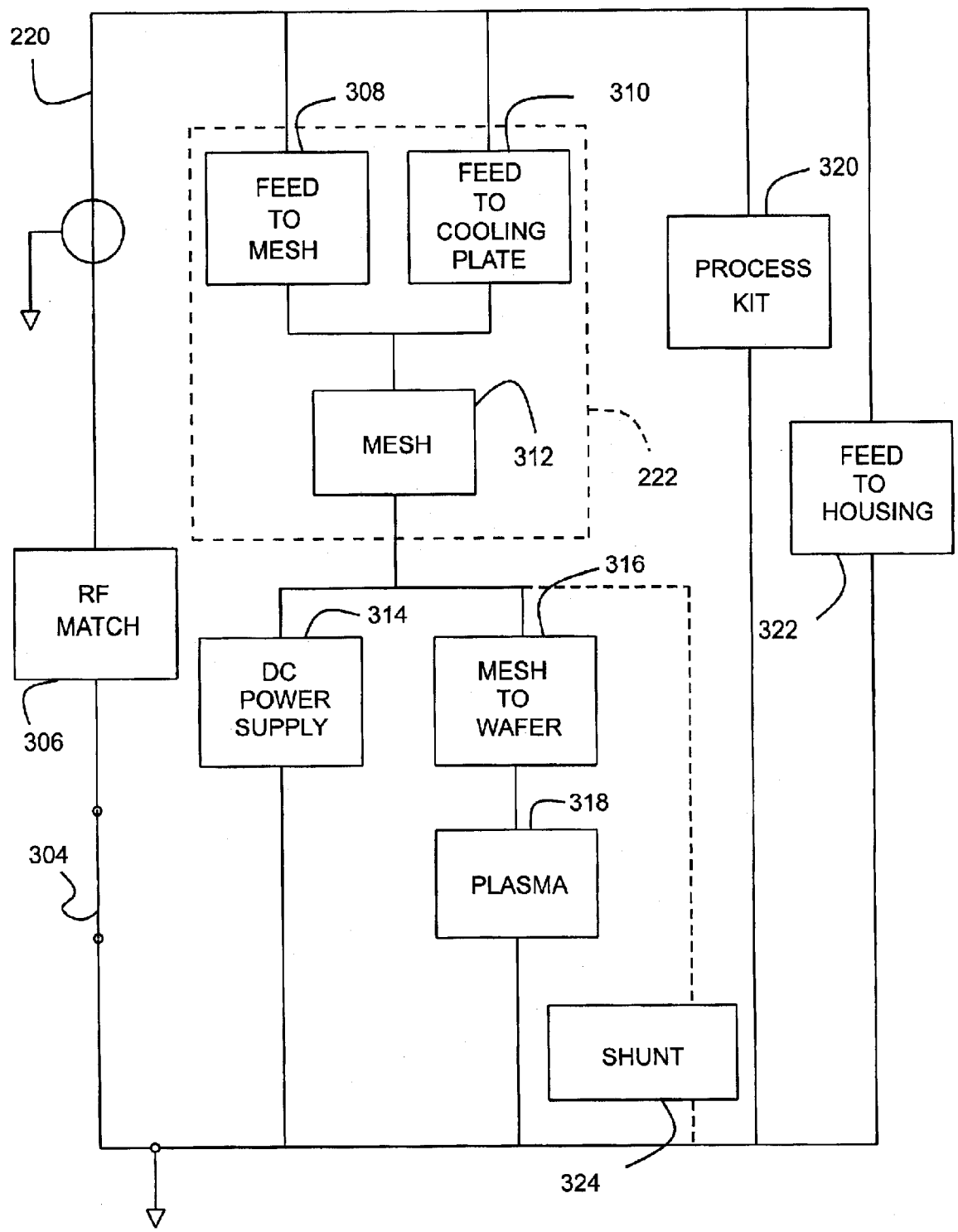
FIG. 3 depicts an equivalent circuit representation of the high harmonic return path for the RF power through the cathode pedestal of FIG. 1.

The plasma generates harmonic energy that is coupled into the structure of FIGS. 1 and 2. The plasma operates as a source of RF power where the plasma RF has a frequency of n×RF drive frequency, where n is an integer having a value of two or more. FIG. 3 depicts a lump element RF model of the chamber when the plasma is treated as an RF source 318. The structural elements are the same as in the model of FIG. 2; however, the complex impedance values are different when computed at the harmonic frequency or frequencies.

Specifically the RF power supply 132 is modeled as a short 304. The match unit, which is tuned to the RF drive frequency (e.g., 13.56 MHz), appears in the harmonic model as an element 306 having a specific complex impedance value. The remaining elements of the model: the DC power supply (element 314), the mesh (element 312), the mesh to wafer coupling (element 316), the 27 MHz source which is the plasma (element 318), the feed to the mesh (element 308), the feed to the cooling plate (element 310), the process kit (element 320) and the feed to housing coupling (element 322) are each modeled as complex impedance values.

From the equivalent circuit model of FIG. 3, the position and design of a harmonic routing circuit (also referred to as a shunt circuit 324) can be developed to shunt the 27 MHz source to ground without coupling much of the 27 MHz though the circuitry of the reactor equivalent circuit. The solution may require the complex impedances to be adjusted to optimize a low impedance path for the harmonic energy. From the adjusted model elements, the physical elements can be adjusted to form a low impedance path for the harmonic energy. An example of a solution to routing the second harmonic of a 13.56 MHz waveform is to include a resonant circuit that couples from the feed structure to ground. The feed structure itself may also be adapted to efficiently couple the harmonic energy from an RF radiator to the resonant circuit. Alternatively, as discussed below, the feed structure itself can be adapted to efficiently couple the harmonic energy to ground without the use of a separate resonant circuit.

Figure 4:
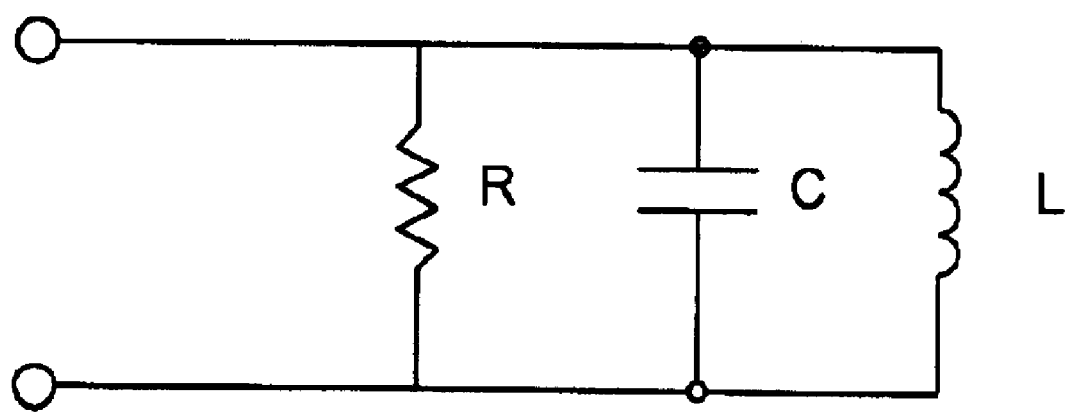
FIG. 4 depicts a schematic diagram of a harmonic shunt circuit in accordance with the present invention.

FIG. 4 depicts one embodiment of a resonant RLC circuit 400 (a harmonic routing circuit) that can be used to shunt the harmonic energy to ground. The particular circuit values of the resistor (R), the inductor (L) and the capacitor (C) are defined by the position of the shunt circuit within the cathode pedestal. For example, placing the circuit 400 on the feed side of the capacitive bank would result in one set of circuit elements that take into account the capacitive bank in the impedance analysis. Alternatively, coupling the RLC circuit to the DC voltage supply conductor would shunt the harmonic energy prior to the capacitor bank and result in a second set of circuit elements.

Figure 5:
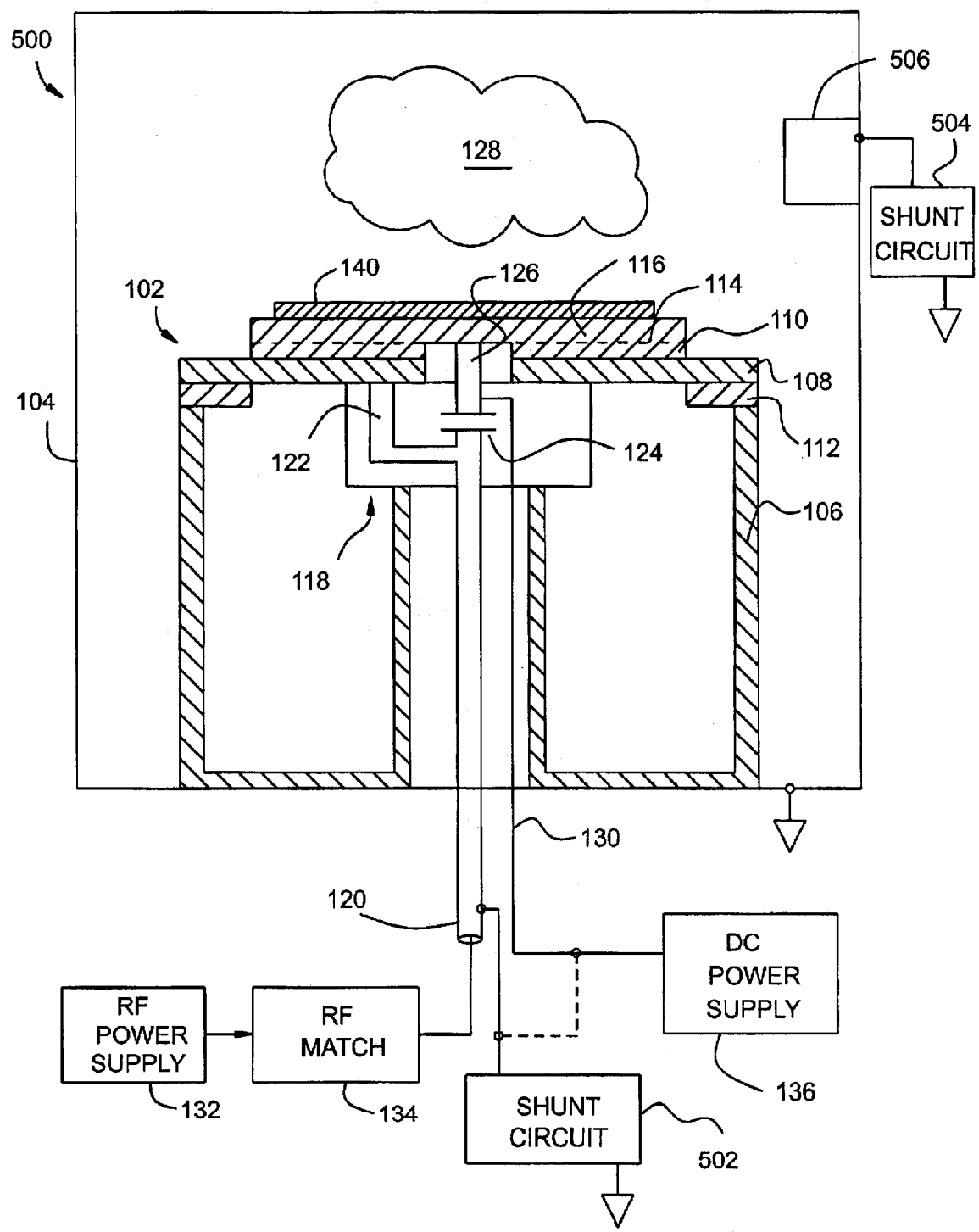
FIG. 5 depicts a schematic cross-sectional view of a dual feed cathode pedestal within a plasma enhanced semiconductor wafer processing chamber that comprises shunt circuits of the present invention.

FIG. 5 depicts a schematic cross-sectional view of a dual feed cathode pedestal 102 within a plasma enhanced semiconductor wafer processing chamber 500 that comprises shunt circuits 502 and/or 504. The elements that are similar to those described with respect to FIG. 1 have the same reference numbers as the elements in FIG. 1. In one embodiment of the invention, the shunt circuit 502 is coupled to either the RF feed (i.e., conductor 120) or the DC feed (i.e., conductor 130). The shunt circuit may be a resonant RLC circuit of FIG. 4 or some other format resonant circuit that routes the harmonic energy from the plasma to ground.

Alternatively, the harmonic routing circuit 504 may be coupled to a probe 506 that extends into, or otherwise contacts, the plasma. The probe 506, being coupled to a low impedance path for the harmonic energy (e.g., circuit 504), would remove the harmonic energy from the chamber 500. The probe 506 could be a dedicated conductive element or it could be an existing chamber component such as a chamber liner, showerhead, RF radiator or process kit.

In the dual feed cathode pedestal of FIG. 1, the feed structure can be modified to facilitate shunting the harmonic energy to ground. Specifically, the inductance and capacitance of the feed structure can be adapted to couple the RF power (e.g., 13.56 MHz) to the plasma, as well as remove the harmonic energy (e.g., 27 MHz) from the plasma. In one embodiment, the capacitor bank capacitance was reduced from 3900 pF to 2200 pF and the length of the third conductor 126 was shortened to reduce the conductor's inductance. Such modification forms a feed structure that has a low impedance at the harmonics of the applied power such that the harmonic energy is extracted from the plasma and routed to ground.

Furthermore, the impedance of each leg of the dual feed structure can be adjusted to optimize the coupling at the harmonic frequencies of the feed elements. For example, the coupling to either the mesh or cooling plate can be modified by changing the impedance of elements 308 and 310. By adjusting these impedances, the plasma uniformity can be improved.

The embodiment of the present invention discussed above is described in context of a pedestal for a semiconductor wafer in an etch chamber. Those skilled in the art will realize that the invention is applicable to other forms of reactors such as physical vapor deposition, chemical vapor deposition wherein a plasma is used for wafer or workpiece processing. By using the invention to control the harmonics generated within the plasma, the uniformity of deposition and etch is improved. Furthermore, the illustrative embodiment was a pedestal with a dual feed structure; however, the invention is applicable to single feed structures (e.g., feed conductor only coupled to the mesh or cooling plate). Broadly speaking, the invention is applicable to chambers having feed structures coupled to N components of the chambers where N is an integer equal to one or more.

While foregoing is directed to the preferred embodiment of the present invention, other and further embodiments of the invention may be devised without departing from the basic scope thereof, and the scope thereof is determined by the claims that follow.

What is claimed is:

1. Apparatus for processing a wafer in a plasma enhanced semiconductor wafer processing chamber comprising:
   a wafer support pedestal;
   an RF radiator attached to the pedestal;
   a feed structure for coupling RF power having a drive frequency to the RF radiator; and
   a harmonic routing circuit for routing harmonic energy having at least one harmonic frequency of the drive frequency to ground.

2. The apparatus of claim 1 wherein said harmonic routing circuit comprises a parallel connected resistor, an inductor and a capacitor, wherein the resistor, inductor and capacitor form a resonant circuit that is resonant at a frequency of a harmonic of the drive frequency.

3. The apparatus of claim 1 wherein the harmonic routing circuit is part of the feed structure.

4. The apparatus of claim 1 wherein the feed structure comprises a first conductor, a second conductor, a third conductor and a capacitor bank, where the first conductor is coupled to the second conductor and the capacitor bank, the second conductor is coupled to a first RF radiator and the third conductor connects the capacitor bank to a second RF radiator.

5. The apparatus of claim 4 wherein a length of the first, second and third conductors and a value of the capacitor bank are tuned to couple RF drive power to the first and second RF radiators and to couple harmonic energy of the RF drive power from the first and second RF radiators to ground.

6. The apparatus of claim 1 wherein the first RF radiator is a cooling plate and the second RF radiator is an electrode within an electrostatic chuck.

7. Apparatus for plasma processing a semiconductor wafer comprising:
   a vessel for containing a plasma;
   a wafer support pedestal for supporting the semiconductor wafer in the vessel;
   an RF radiator attached to the pedestal and driven with RF power that ignites the plasma in the vessel; and
   means for routing harmonic energy from the plasma to ground.

8. The apparatus of claim 7 wherein the means further comprises:
   a probe extending into the plasma; and
   a harmonic routing circuit coupled to the probe.

9. The apparatus of claim 8 wherein the harmonic routing circuit is a resonant circuit that form a low impedance path from the probe to ground at the frequency of the harmonic energy.

10. The apparatus of claim 7 wherein the means comprises a feed structure that is tuned to form a low impedance path from the plasma to ground at the frequency of the harmonic energy.

11. The apparatus of claim 7, wherein the means coupled to a feed structure for coupling RF power to the RF radiator.

12. Apparatus for processing a wafer in a plasma enhanced semiconductor wafer processing chamber comprising:
   a wafer support pedestal including an electrostatic chuck;
   an RF radiator attached to the pedestal, wherein the RF radiator comprises a first RF radiator in the form of a cooling plate and a second RF radiator in the form of an electrode within the electrostatic chuck;
   a feed structure for coupling RF power having a drive frequency to the RF radiator; and
   a harmonic routing circuit for routing harmonic energy having at least one harmonic frequency of the drive frequency to ground.

13. The apparatus of claim 12, wherein said harmonic routing circuit comprises:
   a parallel connected resistor;
   an inductor;
   and a capacitor, wherein the resistor, inductor and capacitor form a resonant circuit that Is resonant at a frequency of a harmonic of the drive frequency.

14. The apparatus of claim 12, wherein the harmonic routing circuit is part of the feed structure.

15. The apparatus of claim 12, wherein the feed structure comprises a first conductor, a second conductor, a third conductor and a capacitor bank, where the first conductor is coupled to the second conductor and the capacitor bank, the second conductor is coupled to the first RF radiator and the third conductor connects the capacitor bank to the second RF radiator.

16. The apparatus of claim 15, wherein a length of the first, second and third conductors and a value of the capacitor bank are tuned to couple RF drive power to the first and second RF radiators and to couple harmonic energy of the RF drive power from the first and second RF radiators to ground.

* * * * *